United States Patent
Wootton et al.

[19]

[11] Patent Number: 5,496,438
[45] Date of Patent: Mar. 5, 1996

[54] METHOD OF REMOVING PHOTO RESIST

[75] Inventors: Phil Wootton, Hamilton; Graeme Morland, Falkirk, both of Scotland; Karl E. Mautz, Austin, Tex.; John Dalziel, Wishaw, Scotland

[73] Assignee: Motorola, Inc., Schaumburg, Ill.

[21] Appl. No.: 353,472

[22] Filed: Dec. 9, 1994

[30] Foreign Application Priority Data

Dec. 23, 1993 [GB] United Kingdom ............... 9326310

[51] Int. Cl.⁶ .................................................. H01L 21/00
[52] U.S. Cl. ........................ 156/643.1; 156/655.1; 156/656.1; 216/58; 216/77; 134/1.1
[58] Field of Search ............................. 156/643.1, 655.1, 156/659.11, 345; 216/58, 77; 134/1.1

[56]         References Cited

U.S. PATENT DOCUMENTS 4,348,473  9/1982  Okumura et al. .................. 430/296
5,221,424  6/1993  Rhoades .......................... 216/77 X
5,248,384  9/1993  Lin et al. ........................ 216/77

FOREIGN PATENT DOCUMENTS 0305946  3/1989  European Pat. Off. .
1484873  9/1977  United Kingdom .

*Primary Examiner*—William Powell
*Attorney, Agent, or Firm*—William E. Koch

[57]            ABSTRACT

A method of removing photoresist (20) from a metal layer (16) formed on a substrate (1) and having a pattern defined by means of a corrosive gas plasma etch. The method consists of etching the resist (20) in an oxygen gas plasma for a period of time and at a sufficiently high temperature to remove all residual corrosive gas absorbed in the photoresist and below the temperature at which the metal beings to flow. An etching time of 3 minutes at 300° C. is typically used.

8 Claims, 3 Drawing Sheets

METHOD OF REMOVING PHOTO RESIST

FIELD OF THE INVENTION

This invention relates to a method of removing photoresist from a metal layer deposited on a substrate and having a pattern defined thereon by means of a corrosive gas plasma etch.

As used herein the term pattern means that at least one area of metal is protected by a photoresist during the plasma etch.

BACKGROUND ART

Metal tracks in integrated circuits are usually formed from aluminium by means of well known photolithography and etching techniques.

Usually a layer of aluminium is formed over the whole surface of a semiconductor substrate, and a pattern defined thereon in photoresist by exposing the resist through a mask and developing the resulting image.

After curing the developed image, aluminium which is no longer protected by the resist is removed, typically in a plasma etching process using a chlorine gas plasma.

After the pattern, defined by the photoresist image, has been etched the photoresist is removed from the remaining aluminium pattern in an asher. This is a plasma etching apparatus in which the resist is removed in an oxygen gas plasma while the substrate is heated.

Two kinds of asher may be used, a barrel asher such as the commercially available Des asher or a single substrate asher such as that manufactured by the company Matrix.

The barrel asher processes several substrates side-by-side together in a retaining boat, which is placed in a glass tube surrounded by a heating coil, to heat the environment containing the substrates to about 230° to 240° C.

In the single substrate system, the substrate is placed upon a heated chuck to heat the substrate directly.

A problem with both the above methods of resist removal is the occurrence of a staining appearance on the remaining aluminium after the removal of the photoresist in the asher.

SUMMARY OF THE INVENTION

The present invention seeks to provide a method of removing photoresist from a metal layer in which the above mentioned problem is mitigated.

According to the present invention, there is provided a method of removing photoresist from a metal layer formed on a substrate and having a pattern defined thereon by means of a corrosive gas plasma, the method including the steps of plasma etching the resist in an oxygen gas plasma for a period of time and at a sufficiently high temperature, to remove substantially all residual corrosive gas absorbed in the photoresist and below the temperature at which the metal begins to reflow.

Typically, the temperature is at least 270° C. and preferably at least 300° C.

Typically the resist is etched for at least two minutes and preferably for at least three minutes.

In a preferred embodiment the resist is etched for 3 minutes at a temperature of 300° C.

Conveniently the resist is etched in a single wafer plasma etcher in which it is heated by being placed on a heated chuck.

In a preferred embodiment of the method the resist is removed from an aluminium pattern.

BRIEF DESCRIPTION OF THE DRAWINGS

An exemplary embodiment of the invention will now be described with reference to the drawings in which.

DETAILED DESCRIPTION OF A PREFERRED EMBODIMENT

Figure 1A:
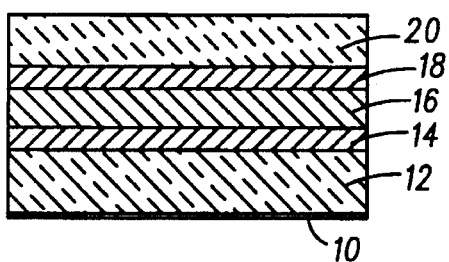
FIGS. 1(a–f) show the process flow for the formation of a metal pattern on a substrate.

Referring to FIG. 1a, there is shown a silicon substrate 10 upon which has been formed by well known semiconductor processing techniques, a layer of oxide 12 to insulate the aluminium to be formed from the silicon substrate.

Onto the oxide layer is formed thin layer 14 of titanium nitride which prevents aluminium spikes.

Onto the titanium nitrite layer is formed the main metallisation layer which is a layer 16 of aluminium.

A further layer 18 titanium nitrite is formed on the aluminium layer 16, to dull the metal surface and assist printing of very fine small geometries using photoresist.

Finally, a layer 20 of photoresist is formed by well known methods onto the layer 18.

All of the above steps are performed using processing steps which are standard in the semiconductor art.

Figure 1B:
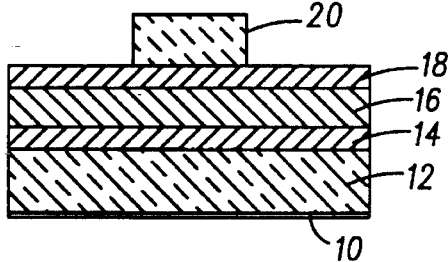
Figure 1D:
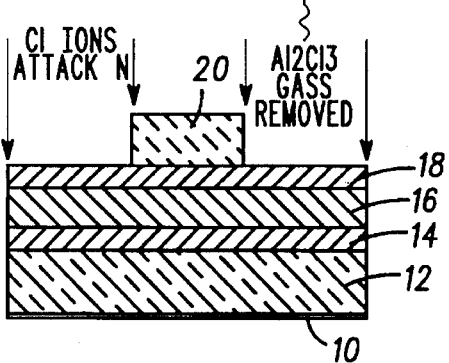
Figure 1C:
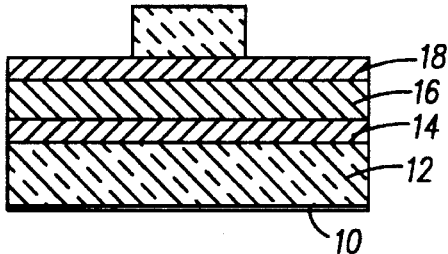

In FIG. 1b, the photoresist is exposed and developed to define a pattern and in FIG. 1c, the remaining resist is hardened by baking, typically at about 125° C.

In FIG. 1d, the substrate is etched in a well known manner in a corrosive gas plasma in this case a chlorine gas plasma, to remove all layers above the oxide, which are not protected by the photoresist.

Figure 1E:
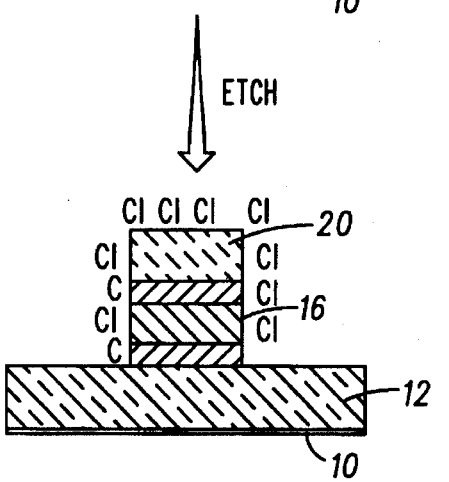

After etching of the metal layer, chlorine ions remain absorbed in the photoresist and on the sidewalls of the metal pattern. This is shown in FIG. 1e.

Figure 1F:
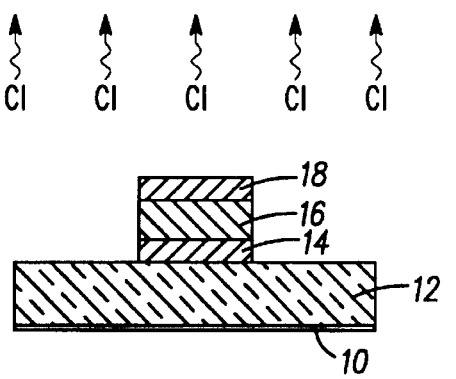

The resist is finally removed by etching in an oxygen plasma as illustrated in FIG. 1f. This process is termed ashing.

Scanning electron microscope analysis of the above mentioned staining which often appears on the aluminium after ashing has revealed that it is corrosion of the aluminium. It is believed that this corrosive staining of the aluminium pattern is caused by absorbed chlorine gas ions.

In prior art methods, the ashing process has been carried out at typical temperatures of about 230° to 240° C.

In accordance with the invention the ashing process is carried out at a higher temperature, typically at least 270° C. and preferably at at least 300° C.

By removing the photoresist in an oxygen plasma at these higher temperatures it has been found that the incidence of corrosive staining in the aluminium pattern is substantially reduced and with the appropriate combination of temperature and time can be substantially eliminated.

The higher the temperature that is used the shorter the time required to avoid all corrosive staining. The only constraint on the maximum temperature is that it must not be so high that the metal layer begins to reflow.

In a preferred embodiment of the method, it has been found that oxygen plasma etching at 300° C. for a period of about 3 minutes is effective in removing substantially all corrosive staining. Reducing the temperature to 270° C. increases the time required to about 5 minutes.

As mentioned it is believed that the observed staining is due to absorbed chlorine ions. These residual chlorine ions can react with moisture to form hydrochloric acid which attacks the aluminium and forms staining of the metal.

By use of higher temperatures for a defined time in the oxygen plasma resist strip, the corrosive residual ions are evaporated from the surface in which they were absorbed, thereby preventing atmospheric corrosion.

In order to obtain accurate control of the substrate temperature, the stripping of the photoresist is preferably carried out in a single wafer plasma etcher, having a heated chuck for carrying the substrate to be stripped.

Figure 2:
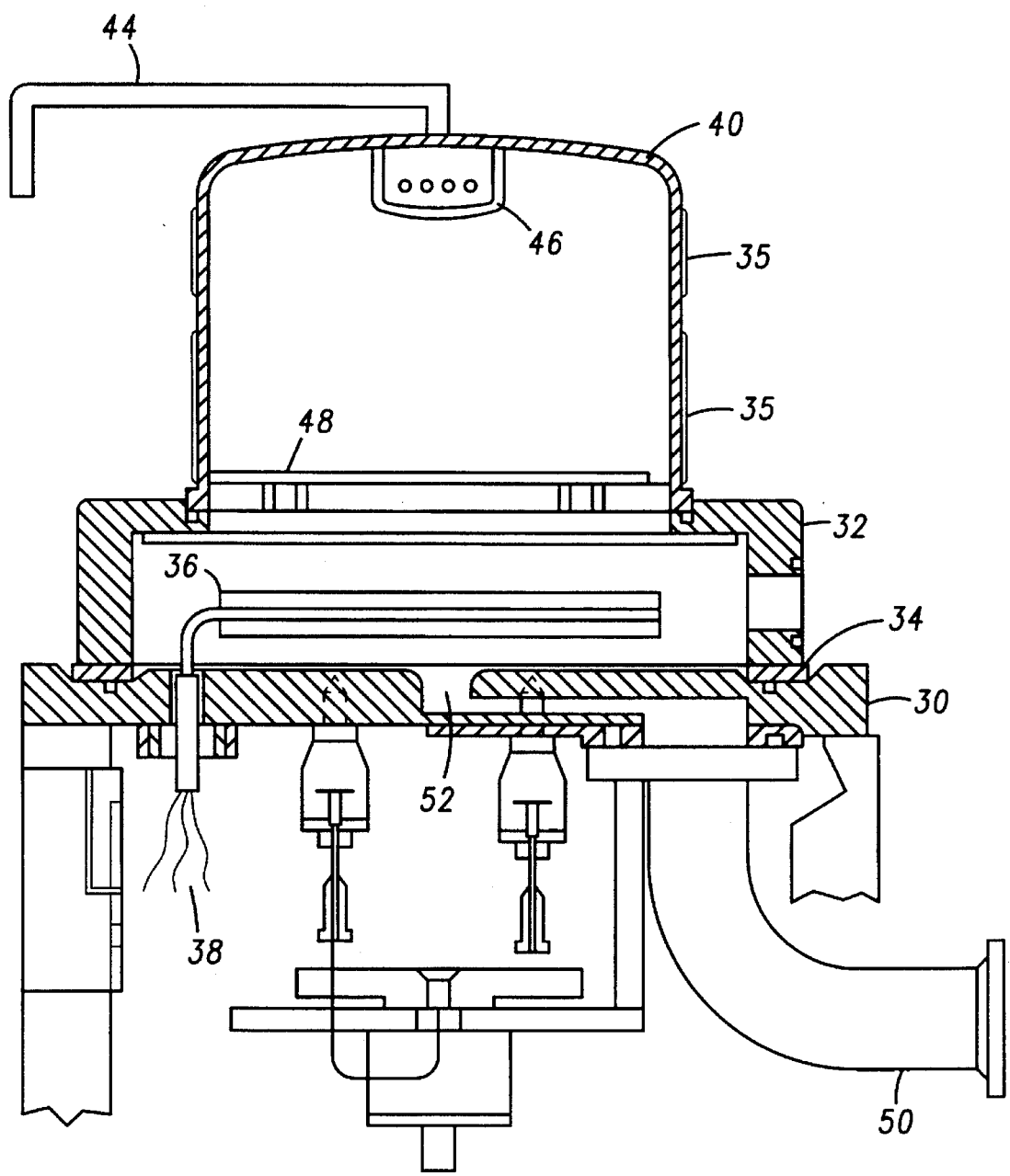
FIG. 2 shows a cross-section of a plasma etching apparatus suitable for carrying out the invention.

One such typical etcher is manufactured by the company Matrix and is illustrated in FIG. 2, to which reference will now be made.

The etcher illustrated comprises a baseplate 30, having a substrate enclosure 32, which is sealed to the baseplate by means of vacuum seal 34.

The substrate enclosure 32 has an entrance door 33 by means of which substrates are introduced into the enclosure 32.

A substrate to be etched is placed onto a so-called closed loop temperature controlled chuck 35, which is heated by means of an electrical current fed through wires 38.

Above the substrate enclosure 32 and vacuum sealed thereto, is plasma chamber 40, surrounded by radial interleaved electrodes 42, which confine the plasma discharge and increase species generation.

Gas, typically oxygen, in which the plasma is struck is introduced through pipe 44 and distribution manifold 46.

Between the substrate enclosure 32 and the plasma is located an optically dense plasma separator 48 which is formed from a perforated glass plate. This acts to separate the dense plasma from the surface of the substrate and eliminate ultra violet exposure on the surface of the substrate.

Finally, the etcher is evacuated through pumping line 50, which is baffled to evacuate through an opening 52, located centrally of the substrate enclosure. This ensures that the gas is drawn under the chuck 36 and down the centre of the plasma chamber.

Figure 3A:
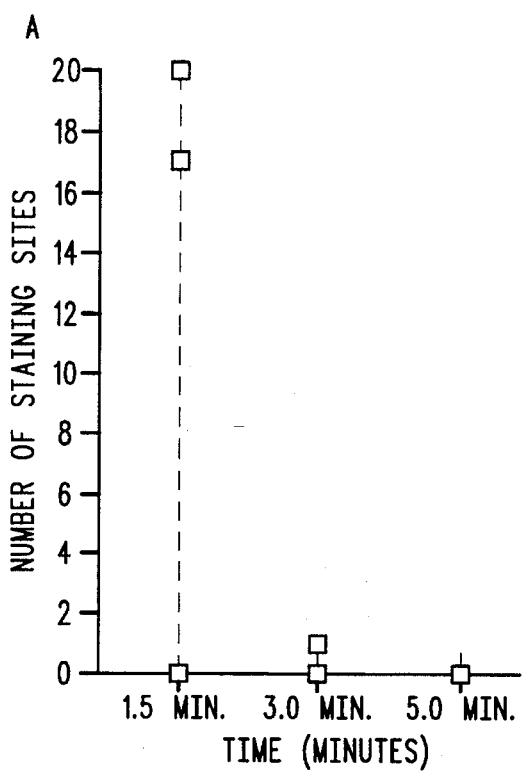
FIGS. 3 and 4 are graphical representations of the relationship between observed metal staining and the time and temperature of the plasma etch.
Figure 3B:
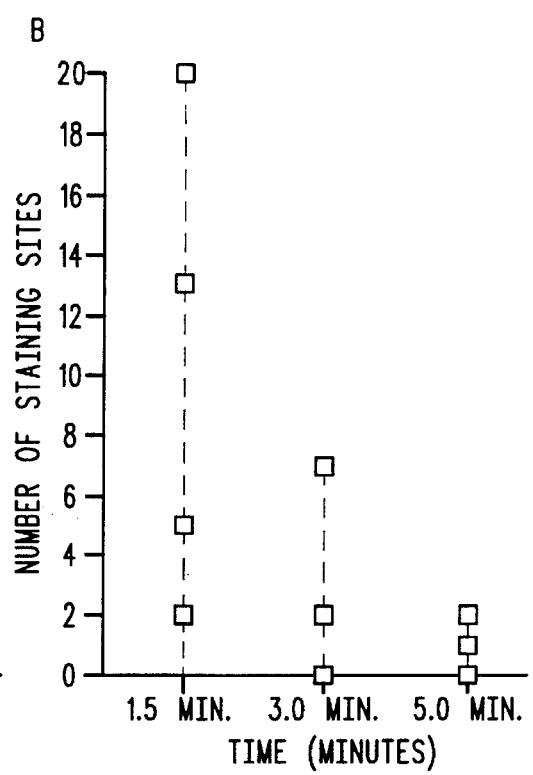
Figure 4A:
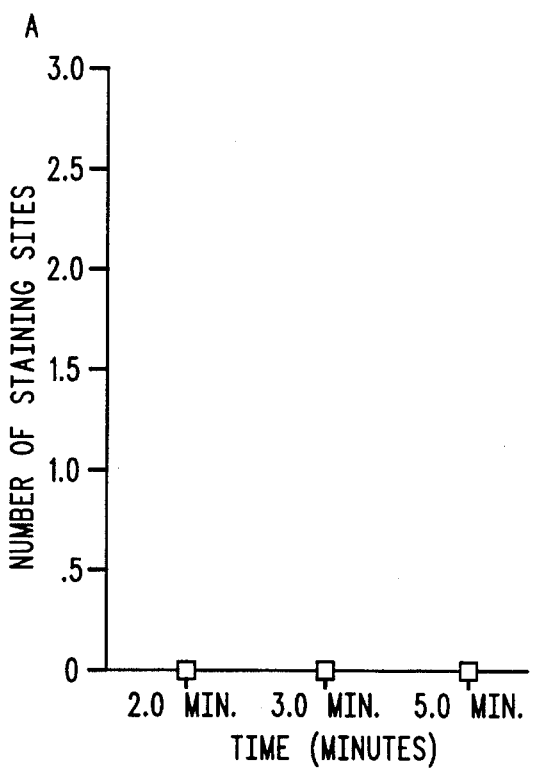
Figure 4B:
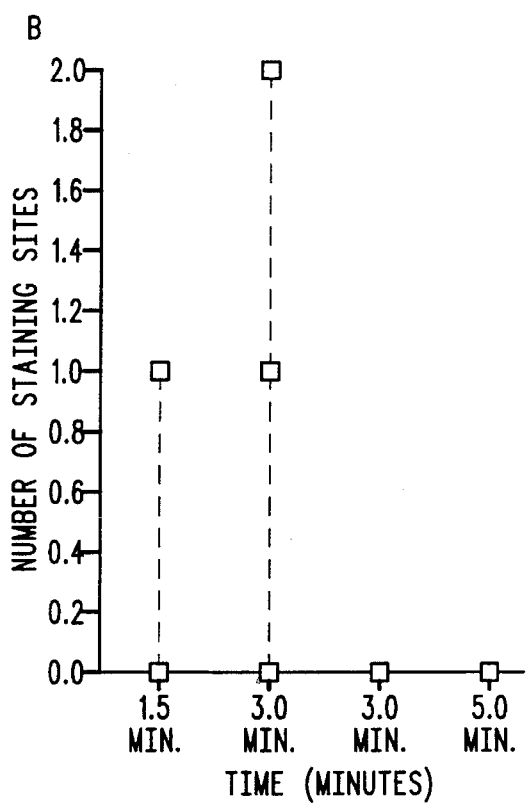

Referring now to FIGS. 3 and 4, these show results of the method of the invention at temperatures of 270° C. and 300° C. respectively.

FIG. 3 shows two graphs a and b, which respectively show the number of sites of staining observed after resist stripping in an oxygen plasma for three different periods of time for each of two batches of substrates. The number of sites with staining is plotted on the vertical axis and the etching time on the horizontal axis.

As can be seen with an etch time of 1.5 minutes, typically 20 sites of staining are observed whilst increasing the time to 5 minutes reduces the number to 2 or fewer.

FIG. 4, shows graphs a and b for two similar batches of substrates etched at a temperature of 300° C. In graph a, the minimum etch time was 2 minutes and in graph b, 1.5 minutes.

In both cases, it can be seen that for times above 2 minutes, the incidence of staining is substantially eliminated. In addition, even for times of 2 minutes and below, a temperature of 300° C. has resulted in a reduction of sites with staining by a factor of about ten.

The invention has been described by way of example and modifications may be made without departing from the scope of the invention. For example, the invention may be employed in reducing staining in metals other than aluminium, such as molybdenum. In fact, the method is applicable to the removal of photoresist from any metal, which has been patterned by means of a corrosive gas plasma etch.

The temperatures and times given are only exemplary and temperatures lower than 270° C. may be used, provided the resulting increase in etching time is tolerable. Also temperatures above 300° C. can be used and would tend to reduce the processing time, provided that the temperature is not sufficiently high to reflow the metal.

We claim:

1. A method of removing photoresist from a metal layer formed on a substrate and having a pattern defined thereon by means of a corrosive gas plasma, the method including the steps of plasma etching the resist in an oxygen gas plasma for a period of time and at a sufficiently high temperature to remove substantially all residual corrosive gas absorbed in the photoresist and below the temperature at which the metal begins to reflow.

2. The method of claim 1 wherein the temperature is at least 270° C.

3. The method of claim 2 wherein the temperature is at least 300° C.

4. The method of claim 1 wherein the resist is plasma etched for at least 2 minutes.

5. The method of claim 4 wherein the resist is plasma etched for at least 3 minutes.

6. The method of claim 1 wherein the resist is etched for 3 minutes at 300° C.

7. The method of claim 1 wherein the resist is etched in a single wafer plasma etcher in which it is heated by being placed on a heated chuck.

8. The method of claim 1 wherein the resist is removed from an aluminium pattern.

\* \* \* \* \*